United States Patent [19]

Maruyama

[11] Patent Number: 4,768,352
[45] Date of Patent: Sep. 6, 1988

[54] COOLING STRUCTURE FOR INTEGRATED CIRCUITS

[75] Inventor: Kazuo Maruyama, Tokyo, Japan

[73] Assignee: NEC Corporation, Tokyo, Japan

[21] Appl. No.: 135,253

[22] Filed: Dec. 21, 1987

[30] Foreign Application Priority Data

Dec. 22, 1986 [JP] Japan .............................. 61-303809

[51] Int. Cl.⁴ .............................................. F25D 3/12
[52] U.S. Cl. .................................... 62/383; 165/80.4; 357/82; 361/385
[58] Field of Search ................. 62/383; 165/185, 80.4; 361/385; 357/82

[56] References Cited

U.S. PATENT DOCUMENTS

| | | | |
|---|---|---|---|
| 2,783,418 | 2/1957 | Peter et al. | 357/82 |
| 3,211,969 | 10/1965 | Colaiaco | 357/82 |
| 3,908,188 | 9/1975 | Kawamoto | 357/82 |
| 3,912,001 | 10/1975 | Missman et al. | 357/82 |
| 4,093,971 | 6/1978 | Chu et al. | 361/385 |
| 4,110,549 | 8/1978 | Goetzke et al. | 357/82 |
| 4,196,775 | 4/1980 | Groh | 165/80.4 |

OTHER PUBLICATIONS

Bhattacharya et al: "Chip Cooling Package", IBM Technical Disclosure Bulletin, vol. 21, No. 2, 7/1978.

*Primary Examiner*—Ronald C. Capossela
*Attorney, Agent, or Firm*—Burns, Doane, Swecker & Mathis

[57] ABSTRACT

A cooling structure for cooling integrated circuits. The cooling structure includes integrated circuit cases inside which one of more integrated circuits are mounted. Cold plates are also included which are superimposed on heat radiation surfaces of the integrated circuit cases, respectively, the cold plates each having one end of which is bent. Pressing members are also included which are superimposed on the cold plates, respectively, the pressing members each having one end of which is bent to oppose the bent one end of a respective one of the cold plates. The cooling structure also includes fixing means which fixes each of the cold plates and a corresponding one of the pressing members to corresponding one or more of the integrated circuit cases in a freely detachable manner. The cooling structure also includes cooling pipes with each of the cooling pipes being held in at least one space formed between one end of at least one of the cold plates and one end of a corresponding one of the pressing members.

20 Claims, 2 Drawing Sheets

COOLING STRUCTURE FOR INTEGRATED CIRCUITS

BACKGROUND OF THE INVENTION

The invention relates to a cooling structure for cooling a plurality of integrated circuits (IC's).

In a prior art cooling structure for cooling IC's, cooling metal pipes are fixed by solder on heat radiation surfaces of integrated-circuit cases which are mounted on a printed wiring board and inside which IC's are mounted. The cases are cooled with the cooling metal pipes through which coolant flows. However, in the prior art structure, troublesome replacement of a defective IC is not avoidable, as described later in more detail by referring to a drawings.

An object of the invention is, therefore, to provide a cooling structure free from the above-mentioned disadvantages of the prior art structure.

SUMMARY OF THE INVENTION

According to an aspect of the invention, there is provided a cooling structure which comprises: integrated circuit cases inside which integrated circuits are mounted; cold plates which are Superimposed on heat radiation surfaces of the integrated circuit cases, respectively, the cold plates each having one end of which is bent; pressing members which are superposed on said cold plates, respectively, and one ends of which are bent to oppose the bent one end of a respective one of the cold plates; fixing means for fixing each of said cold plates and a corresponding one of the pressing members to corresponding one or more the integrated circuit cases in a freely detachable manner; and cooling pipes, each cooling pipe being held in at least one space between one end of at least one of the cold plates and one end of at least one of the pressing members.

BRIEF DESCRIPTION OF THE DRAWINGS

The features and advantages of the invention will become more apparent from the following description when taken in conjunction with the accompanying drawings wherein.

In the drawings, the same reference numerals represent the same structural elements.

DETAILED DESCRIPTION OF THE PREFERRED EMBODIMENT

Figure 1:
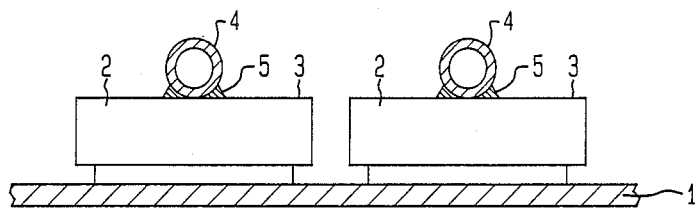
FIG. 1 is a cross-sectional view of a prior art cooling structure.

Referring to FIG. 1, in a prior art cooling structure for cooling IC's, cooling pipes 4 are fixed with solder 5 on heat radiation surfaces 3 of IC cases 2 which are mounted on a printed wiring board 1 and inside which IC's (not shown) are mounted. The cases 2 are cooled with the pipes 4 through which coolant flows.

The prior art cooling structure is disadvantageous because when a defective IC is to be replaced, it is necessary to dismount the IC together with the case 2 by melting the solder 5 in order to package a new IC case having a new IC therein on the printed wiring board 1 by soldering. Further, it is extremely difficult to arrange the height of all the cases to be uniform when a large number of IC cases are mounted on the printed wiring board 1. As a result, soldering must be done with laborious work of bending the cooling pipes of a considerably high rigidity to compensate for the height difference between the cases. The bending work causes damage of the cooling pipes and the IC's because of stress imposed on them.

Figure 2:
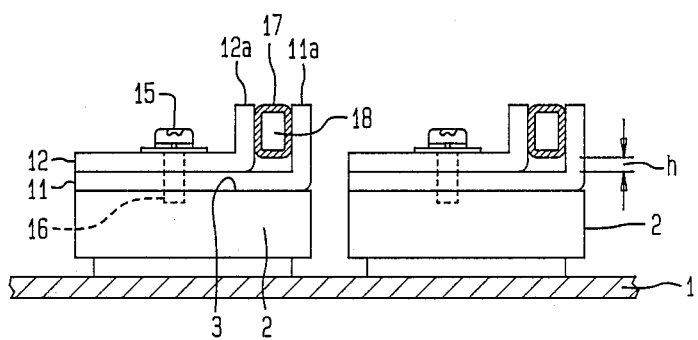
FIG. 2 is a cross-sectional view of a first embodiment of the invention.

Referring to FIG. 2, a first embodiment of the invention comprises a printed wiring board 1, and IC cases 2 which are mounted on the printed wiring board and inside which IC's are mounted. Each of the cases 2 is formed like a box, and its upper surface 3 is a heat radiation surface for radiating heat from the IC mounted within it. The IC cases 2 are arranged in a relatively close proximity to each other on the board 1 in the embodiment.

The embodiment further comprises cold plates 11 superposed on the heat radiation surfaces 3 of the IC cases 2, respectively, and pressing members 12 superposed on the cold plates 11. The lower surfaces of the cold plates 11 snugly contact the heat radiation surfaces 3 while the upper surfaces thereof snugly contact the lower surfaces of the pressing members 12. These cold plates 11 and the pressing members 12 are made of metal plates of copper, aluminum and so on having a high thermal conductivity. An end 11a of each cold plate and an end 12a of each pressing member are bent in the direction perpendicular to the heat radiation surfaces 3. Above each case 2, a space 18 is formed between the bent ends 11a and 12a. The lengths of the ends 11a and 12a are selected to be higher than the diameters of cooling pipes 17 by a length of h. A fixing screw 15 penetrates through fixing holes bored through the cold plate 11 and the pressing member 12 on the case 2 to be mated with a threaded hole 16 of the case 2 and to fix the plate 11 and the member 12 to the case 2. Each of the fixing holes has an internal diameter somewhat larger than the outer diameter of the screwed portion of the fixing screw 15 so that even if the mounted position on the board 1 of the case 2 deviates from the proper position in design, the deviation can be absorbed.

The cooling pipe 17 is held between the end 11a and the end 12a and has a rectangular cross-section to increase the area across which the ends 11a and 12a come in contact with the pipe 17.

In the cooling structure mentioned above, the cold plate 11 and the pressing member 12 can be fixed to the case 2, and the cooling pipe 17 can be mounted in the space 18 between the ends 11a and 12a simply by mating the fixing screw 15 with the threaded hole 16. The heat generated by the IC in the case 2 is conducted from the case 2 to the cooling pipe 17 via the cold plate 11 and the pressing member 12 to ultimately be transmitted to the coolant which is flowing through the pipe 17.

By removing the fixing screw 15 from the threaded hole 16, the cold plate 11 and the pressing member 12 can easily be dismounted from the case 2 and simultaneously the cooling pipe 17 can be dismantled.

Since the ends 11a and 12a extend in the direction perpendicular to the heat radiation surfaces 3, a discrepancy in the height among the cases 2, which may occur when they are packaged on the board 1, can be absorbed within a range of h to hold the pipes 17 without giving disadvantageous effects on the pipes 17 and the cases 2. In other words, no stress is exerted on the cases 2 or on the pipes 17.

Figure 3:
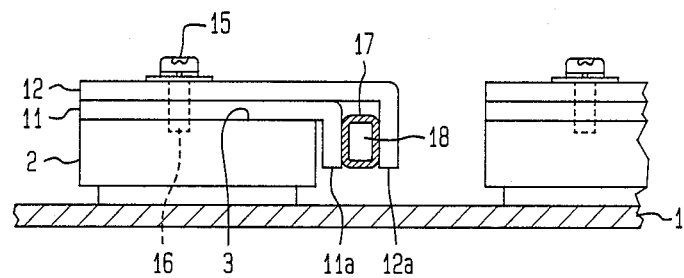
FIG. 3 is a cross-sectional view of a second embodiment of the invention.

In FIG. 3 illustrating a second embodiment of the invention, since spaces are provided between adjacent ones of the cases 2, the ends 11a and 12a of the cold plates 11 and the pressing members 12 are bent toward the board 1. The space 18 is formed between the end 11a of the plate 11 and the end 12a of the member 12. In the embodiment, the pipes 17 can be positioned in the spaces formed between the IC cases 2 to avoid an increase in the height of the cooling structure.

Figure 4:
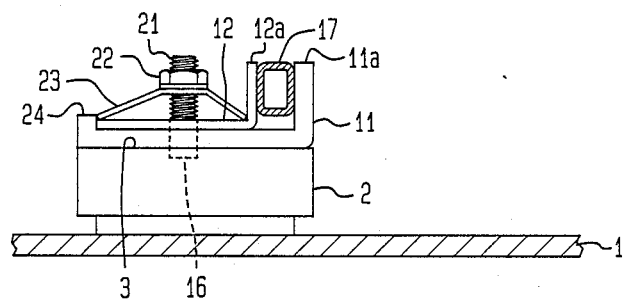
FIG. 4 is a cross-sectional view of a third embodiment of the invention.

In a third embodiment of the invention shown in FIG. 4, fixing means comprises a stud bolt 21 screwed on the IC case 2, a nut 22 mated with the stud bolt 21, and a spring member 23 inserted between the nut 22 and the pressing member 12 and bent in a boomerang like shape. The cold plate 11 is provided with a stop 24 on an end thereof to hold an end of the member 23.

By simply tightening the nut 22, the spring member 23 is deformed to press the pressing member 12 in the direction toward the cold plate 11. This facilitates the attachment of the cooling pipe 17.

Although the above description concerns the embodiments wherein one cold plate and one pressing member are fixed on one IC case and the cooling pipes have a rectangular cross-section, the invention is by no means limited to such a structure. The shape of the pipes may be arbitrarily determined including the one having a circular cross-section. If a cold plate and a pressing member are extended in the direction along the cooling pipe held thereby, they may be shared by the IC cases positioned under the same cooling pipe.

While this invention has been described in conjunction with the preferred embodiments thereof, it will now be readily possible for those skilled in the art to put this invention into practice in various other manners.

What is claimed is:

1. A cooling structure for cooling integrated circuits comprising:
   integrated circuit cases inside which one or more integrated circuits are mounted;
   cold plates which are superimposed on heat radiation surfaces of said integrated circuit cases, respectively, said cold plates each having one end of which is bent;
   pressing members which are superimposed on said cold plates, respectively, said pressing members each having one end of which is bent to oppose said bent one end of a respective one of said cold plates;
   fixing means which fixes each of said cold plates and a corresponding one of said pressing members to corresponding one or more of said integrated circuit cases in a freely detachable manner; and
   cooling pipes, said cooling pipes each being held in at least one space formed between said one end of at least one of said cold plates and said one end of a corresponding one of said pressing members.

2. A cooling structure for an integrated circuit comprising:
   at least one integrated circuit case inside which at least one integrated circuit is mounted,
   at least one cold plate which is superimposed on a heat radiation surface of at least one said integrated circuit case, each said cold plate having one end of which is bent,
   at least one pressing member which is superimposed on at least one said cold plate, each said pressing member having one end of which is bent to oppose said bent one end of said respective cold plate on which it is superimposed,
   fixing means which fixes each said cold plate and a corresponding pressing member to at least one corresponding integrated circuit case in a freely detachable manner, and
   at least one cooling pipe, each said cooling pipe being disposed in at least one space formed between said one end of at least one said cold plate and said one end of a corresponding pressing member.

3. The cooling structure as set forth in claim 2 wherein said one end of said at least one cold plate is bent in a perpendicular direction to said heat radiation surface, and wherein said one end of said at least one pressing member is bent in a perpendicular direction to said heat radiation surface.

4. The cooling structure as set forth in claim 3 wherein the length of said one end of said at least one cold plate and the length of said one end of at least one corresponding pressing member are each higher than the height of said cooling pipe disposed in said space formed therebetween.

5. The cooling structure as set forth in claim 4 wherein said at least one cooling pipe has a rectangular cross-section.

6. The cooling structure as set forth in claim 4 wherein said at least one cooling pipe has a circular cross-section.

7. The cooling structure as set forth in claim 3 wherein said fixing means includes at least one fixing screw adapted to pass through a fixing hole bored through said at least one cold plate and a fixing hole bored through a corresponding pressing member and adapted to engage with a threaded hole in a corresponding integrated circuit case.

8. The cooling structure as set forth in claim 7 wherein said at least one fixing hole in said at least one cold plate and said fixing hole in said corresponding pressing member each have an internal diameter larger than the outer diameter of said corresponding fixing screw adapted to pass therethrough.

9. The cooling structure as set forth in claim 3 wherein said fixing means includes at least one stud bolt adapted to screw into a corresponding integrated circuit case, at least one nut adapted to engage with a corresponding stud bolt, and at least one spring member positioned between a corresponding nut and a corresponding pressing member.

10. The cooling structure as set forth in claim 9 wherein at least one cold plate has on the end opposite said one end thereof a stop adapted to hold an end of a corresponding spring member.

11. The cooling structure as set forth in claim 2 wherein said at least one cold plate is made of a metal having a high thermal conductivity.

12. The cooling structure as set forth in claim 2 wherein said at least one pressing member is made of a metal having a high thermal conductivity.

13. The cooling structure as set forth in claim 12 wherein said at least one cold plate is made of a metal having a high thermal conductivity.

14. The cooling structure as set forth in claim 13 wherein said metal of which said at least one pressing member is made is selected from the group consisting of copper and aluminum, and wherein said metal of which said at least one cold plate is made is selected from the group consisting of copper and aluminum.

15. The cooling structure as set forth in claim 2 wherein a plurality of integrated circuit cases are provided in spaced relation to each other and said one end of said at least one cold plate and said one end of at least one corresponding pressing member are disposed in a space between adjacent integrated circuit cases.

16. The cooling structure as set forth in claim 15 wherein said one end of said at least one cold plate and said one end of at least one corresponding pressing member are each bent towards a printed wiring board on which said plurality of integrated circuit cases are mounted.

17. The cooling structure as set forth in claim 16 wherein the length of said one end of said at least one cold plate and the length of said one end of a corresponding pressing member are each higher than the height of said at least one cooling pipe disposed in said space formed therebetween.

18. The cooling structure as set forth in claim 17 wherein said at least one cooling pipe has a rectangular cross-section.

19. The cooling structure as set forth in claim 17 wherein said at least one cooling pipe has a circular cross-section.

20. The cooling structure as set forth in claim 16 wherein said at least one cold plate is made of a metal having a high thermal conductivity and wherein said at least one pressing member is made of a metal having a high thermal conductivity.

* * * * *